(12) United States Patent
Ouyang et al.

(10) Patent No.: US 11,910,658 B2
(45) Date of Patent: Feb. 20, 2024

(54) DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Qi Ouyang, Hubei (CN); Min Zheng, Hubei (CN)

(73) Assignee: WUHAN CHINA STAR OPTOELECTRONICS SEMICONDUCTOR DISPLAY TECHNOLOGY CO., LTD, Wuhan (CN)

( * ) Notice: Subject to any disclaimer, the term of this patent is extended or adjusted under 35 U.S.C. 154(b) by 924 days.

(21) Appl. No.: 16/771,699

(22) PCT Filed: Oct. 29, 2019

(86) PCT No.: PCT/CN2019/113908
§ 371 (c)(1),
(2) Date: Jun. 11, 2020

(87) PCT Pub. No.: WO2021/031337
PCT Pub. Date: Feb. 25, 2021

(65) Prior Publication Data
US 2023/0225157 A1 Jul. 13, 2023

(30) Foreign Application Priority Data
Aug. 20, 2019 (CN) .......................... 201910766703.8

(51) Int. Cl.
*H10K 59/123* (2023.01)
*H10K 59/12* (2023.01)
(Continued)

(52) U.S. Cl.
CPC ....... *H10K 59/123* (2023.02); *H10K 59/1201* (2023.02); *H10K 59/122* (2023.02);
(Continued)

(58) Field of Classification Search
CPC .. H10K 59/121; H10K 59/122; H10K 59/123; H10K 59/124; H10K 59/1213; H10K 77/10; H10K 77/111
See application file for complete search history.

(56) References Cited

U.S. PATENT DOCUMENTS 11,114,627 B2 * 9/2021 Yu ........................ H10K 77/111
2014/0097408 A1 4/2014 Kim
2016/0014881 A1 1/2016 Shin et al.

FOREIGN PATENT DOCUMENTS

CN  103928398 A  7/2014
CN  107068862 A  8/2017
(Continued)

OTHER PUBLICATIONS

Machine-generated English-language translation of CN-110112191-A.*

*Primary Examiner* — Vu A Nguyen
(74) *Attorney, Agent, or Firm* — Soroker Agmon Nordman Riba

(57) ABSTRACT

The present disclosure provides a display device and a manufacturing method thereof. The display device includes a display region and a non-display region surrounding the display region. The display region includes a main display region and an auxiliary region surrounding the main display region. The auxiliary region is between the non-display region and the main display region. The non-display region includes a bending region connected to the auxiliary region. The display device includes an array substrate including a plurality of pixels units, first trough holes, and second trough holes in the display region. The first trough holes and the (Continued)

second trough holes are disposed in the auxiliary region. The second trough holes are disposed between two adjacent pixel units. An anode electrode is disposed on the array substrate. The first trough holes are disposed in each the pixel units and directly below the anode electrode.

7 Claims, 3 Drawing Sheets

(51) Int. Cl.
*H10K 59/122* (2023.01)
*H10K 59/121* (2023.01)
*H10K 59/124* (2023.01)
*H10K 77/10* (2023.01)
*H10K 102/00* (2023.01)

(52) U.S. Cl.
CPC ....... *H10K 59/124* (2023.02); *H10K 59/1213* (2023.02); *H10K 77/111* (2023.02); *H10K 2102/311* (2023.02)

(56) References Cited

FOREIGN PATENT DOCUMENTS

| CN | 108288637 A | * | 7/2018 | ............. G09F 9/301 |
|----|-------------|---|--------|--------------------------|
| CN | 108288637 A |   | 7/2018 |                          |
| CN | 108682307 A |   | 10/2018 |                         |
| CN | 109671761 A |   | 4/2019 |                          |
| CN | 110112186 A |   | 8/2019 |                          |
| CN | 110112191 A | * | 8/2019 | ......... H01L 27/3244   |
| CN | 110112191 A |   | 8/2019 |                          |

* cited by examiner

DISPLAY DEVICE AND MANUFACTURING METHOD THEREOF

FIELD OF INVENTION

The present disclosure relates to the field of display technologies, and more particularly, to a display device and a manufacturing method thereof.

BACKGROUND OF INVENTION

Organic light-emitting diode (OLED) display panels have become a main trend of display due to having advantages such as self-luminous, wider viewing angles, higher contrast, and quicker response speed. Along with people's pursuance of better user experiences, full-screen and narrow bezel have become main development points of display fields. Meanwhile, flexible OLED display panels have become especially popular due to having advantages such as thin and lightweight screen, smaller size, portability, and better user experience.

An entirely flexible display panel has yet to appear on the market, while existing flexible OLED display panels can only be bent in bending regions. However, stress generated from the bending regions is transmitted to display regions when the display panels are bent. As a result, the display regions may crack or other drawbacks may be caused.

Technical Problems

In order to solve the above-mentioned technical problems, the present disclosure provides a display device and a manufacturing method of the display device, which provide an auxiliary region disposed between the display region and the bending region, and provide trough holes in the auxiliary region so that paths for delivering stress are blocked or are extended. As a result, problems such as cracks in the display regions and other drawbacks are improved.

SUMMARY OF INVENTION

The technical solution for solving the above-mentioned problems is: the present disclosure provides a display device including a display region and a non-display region surrounding the display region. The display region comprises a main display region and an auxiliary region surrounding the main display region. The auxiliary region is disposed between the non-display region and the main display region. The non-display region comprises a bending region connected to the auxiliary region. The display device comprises an array substrate disposed in the display region and comprises pixel units, first trough holes, and second trough holes. The first trough hole and the second trough hole are both disposed in the auxiliary region between the bending region and the main display region. An anode electrode disposed on the array substrate. The first trough holes are correspondingly disposed in each of the pixel units and are disposed directly below the anode electrode, the second trough hole is disposed between two adjacent pixel units; and In an embodiment of the present disclosure, the array substrate comprises a base substrate extending from the display region to the non-display region. A blocking layer is disposed on the base substrate and extends from the display region to the non-display region. A buffer layer is disposed on the blocking layer and extends from the display region to the non-display region. An active layer is disposed on the buffer layer in the display region. A first gate insulating layer covers on the active layer and the buffer layer and extends from the display region to the non-display region. A second gate insulating layer covers on the first gate layer and the first gate insulating layer and extends from the display region to the non-display region. A second gate layer covers on the second gate insulating layer in the display region. A dielectric interlayer covers on the second gate insulating layer and the second gate layer and extends from the display region to the non-display region. A source electrode and a drain electrode are disposed on a dielectric interlayer in the display region and are correspondingly connected to the active layer. A planarization layer covers on the source electrode, the drain electrode, and the dielectric interlayer and extends from the display region to the non-display region. The anode electrode is correspondingly disposed on the planarization layer and is correspondingly connected to the drain electrode. A pixel defining layer covers on the planarization layer and extends from the display region to the non-display region. The first trough hole extends from the dielectric interlayer to a surface of the active layer. The second trough hole extends from the dielectric interlayer to the blocking layer or to an inside of the buffer layer.

In an embodiment of the present disclosure, each of the pixel units corresponds to the source electrode, the drain electrode, and at least one of the first trough holes. The first trough hole is disposed between the source electrode and the drain electrode of a corresponding one of the pixel units.

In an embodiment of the present disclosure, the array substrate further comprises a third trough hole disposed in the bending region and extending from the dielectric interlayer to the blocking layer or the inside of the buffer layer; and comprises a filling layer filled in the third trough hole.

In an embodiment of the present disclosure, the second trough hole is further disposed between one of the pixel units close to the main display region and the main display region, and/or disposed between one of the pixel units close to the bending region and the bending region.

In an embodiment of the present disclosure, the first trough hole and the second trough hole are filled with an organic material or an inorganic material in the planarization layer.

The present disclosure further provide a manufacturing method for manufacturing the display panel comprising: forming the array substrate, forming the pixel units, wherein the auxiliary region is between the bending region and the main display region, the first trough holes are formed in each of the pixel units, the second trough holes are formed between two adjacent pixel units; forming the anode electrode on the array substrate, and the first trough hole disposed directly below the anode electrode.

In an embodiment of the present disclosure, forming the array substrate comprises: forming a base substrate extending from the display region to the non-display region; forming a blocking layer on the base substrate in the display region and the non-display region; forming a buffer layer on the blocking layer in the display region and the non-display region; forming an active layer on the buffer layer in the display region; forming a first gate insulating layer on the active layer and the buffer layer in the display region and the non-display region; forming a first gate layer on the first gate insulation layer in the display region; forming a second gate insulating layer on the first gate insulating layer and the first gate layer in the display region and the non-display region; forming a second gate layer on the second gate insulating layer in the display region; and forming a dielectric interlayer on the second gate insulating layer and the second gate layer in the display region and the non-display region; wherein in each of the pixel units in the display region, two via holes are formed and extended from the dielectric interlayer to a surface of the active layer, and the first trough hole is simultaneously formed between the two via holes; between two adjacent pixel units in the auxiliary region, the second trough hole is formed and extended from the dielectric interlayer to the blocking layer or extended from the dielectric interlayer to an inside of the buffer layer; depositing a metal material in the via holes and forming a source electrode and a drain electrode in the dielectric interlayer; depositing an organic material or an inorganic material in the second trough hole and forming a planarization layer on surfaces of the dielectric interlayer, the source electrode, and the drain electrode.

In an embodiment of the present disclosure, forming the anode electrode on the array substrate comprises: forming the anode electrode on the planarization layer in the display region, wherein the anode electrode is disposed directly above the first trough hole in the auxiliary region; and forming a pixel defining layer on the planarization layer in the display region and the non-display region after forming the anode electrode on the array substrate.

In an embodiment of the present disclosure, while forming the second trough hole extended from the dielectric interlayer to the blocking layer or extended from the dielectric interlayer to the inside of the buffer layer, forming a third trough hole extended from the dielectric interlayer to the blocking layer or extended front the dielectric interlayer to the inside of the buffer layer in the bending region of the non-display region; filling the third trough hole with an organic photoresist, material to form a filling layer before forming the source electrode and the drain electrode; and forming metal wires on the filling layer while forming the source electrode and the drain electrode.

Beneficial Effects

The present disclosure provides a display device and a manufacturing method of the display device, which provide an auxiliary region disposed between the display region and the bending region, and provide trough holes in the auxiliary region so that paths for delivering stress are blocked or are extended. As a result, problems such as cracks in the display regions and other drawbacks are improved. By digging holes in the auxiliary region of the display region, not only can the issue of stress transmission be improved, but it can also ensure that the main display region will not be affected by digging, and poor electrical properties will not be caused.

DESCRIPTION OF DRAWINGS

In order to clarify the technical solutions of embodiments of the present disclosure, drawings required to describe the embodiments are briefly illustrated. Obviously, the mentioned embodiments are only parts of the embodiments instead of all of the embodiments. Other embodiments that can be obtained by a skilled person in the art without creative effort fall in the protected scope of the present disclosure.

The present disclosure is illustrated as the following, accompanied by drawings and embodiments.

REFERENCE NUMBERS

Figure 1:
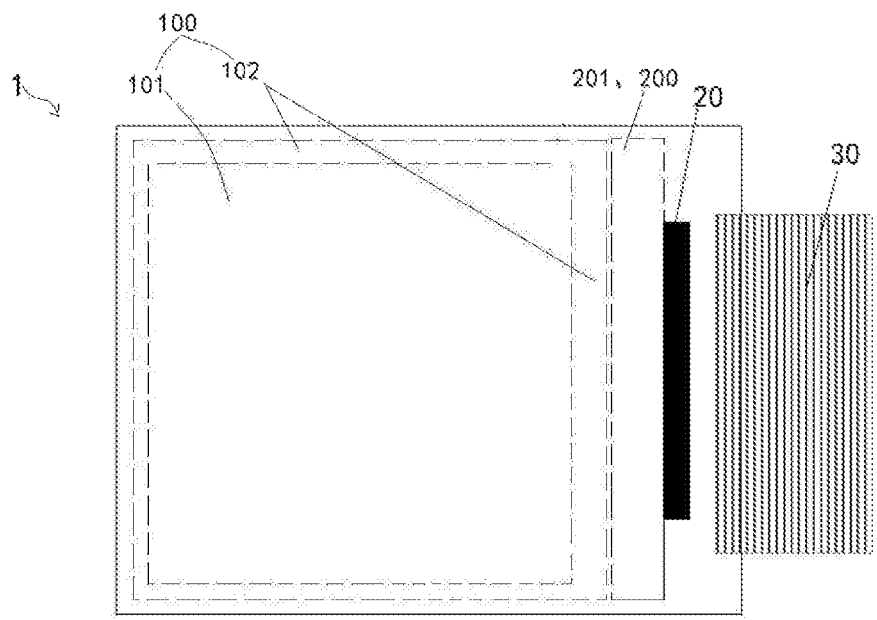
FIG. 1 illustrates a structural diagram of a display device of an embodiment of the present disclosure, and mainly illustrates an auxiliary region of a display region.

| | |
|---|---|
| 1 display device; | 100 display region; |
| 101 main display region; | 102 auxiliary region; |
| 200 non-display region; | 201 bending region; |
| 11 array substrate; | 12 anode electrode; |
| 13 pixel defining layer; | 20 IC; |
| 30 printed circuit board; | 10 pixel units; |
| 111 base substrate; | 112 blocking layer; |
| 113 buffer layer; | 114 active layer; |
| 115 first gate insulating layer; | 116 first gate layer; |
| 117 second gate insulating layer; | 118 second gate layer; |
| 119 dielectric interlayer; | 110 planarization layer; |
| 1101 source electrode; | 1102 drain electrode; |
| 1103 metal wire; | 3 first trough hole; |
| 4 second trough hole; | 5 third trough hole; |
| 6 via hole | 7 filling layer. |

DETAILED DESCRIPTION OF PREFERRED EMBODIMENTS

The following description of the various embodiments is provided with reference of drawings to illustrate specific embodiments. Directional terms mentioned in the present disclosure, such as upper, lower, front, back, left, right, inside, outside, lateral, etc., are only referring to the direction of the drawing. Therefore, the directional terms used to describe and clarify the present disclosure should not be viewed as limitations of the present disclosure. In the drawing, structurally similar elements are denoted by the same reference numbers.

As shown in FIG. 1, in an embodiment, a display device 1 of the present disclosure includes a display region 100 and a non-display region 200 surrounding the display region 100. The display region 100 include s a main display region 101 and an auxiliary region 102 surrounding the main display region 101. The auxiliary region 102 is disposed between the non-display region 200 and the main display region 101. The non-display region 200 includes a bending region 201 connected to the auxiliary region 102.

The display device 1 includes an array substrate 11, an integrated circuit (IC) 20, and a printed circuit board (PCB) 30.

In the bending region 201 in contrast with rigid organic light-emitting diode (OLED), as fan-out area of a flexible pad bending of metal wires 1103 in the array substrate 11 adopts a source wire and a drain wire, instead of a gate wire, to connected to external circuits. In this embodiment, the source wire and the drain wire of the display region 100 in the array substrate 11 are connected to the IC 20 as connection wires of the fan-out area. The IC 20 is connected to the PCB 30.

The main design point of the display device 1 in this embodiment is that the display device 1 includes the array substrate 11 making the auxiliary region 102 of the present disclosure block or extend stress transmission paths to improve a series of undesirable problems such as cracks in the display region 100. Therefore, other components of the display device 1 (such as a substrate, a frame, or other diaphragms for improving optical quality, etc.) are not described here.

The following description illustrates the auxiliary region 102 of the array substrate 11, accompanied by FIG. 2 to FIG. 6. Please refer to FIG. 6, the display device 1 includes the array substrate 11, an anode electrode 12, and a pixel defining layer 13. The array substrate 11 has a plurality of pixel units 10, first trough holes 3, and second trough holes 4. The first trough holes and the second trough holes are disposed in the auxiliary region 102 between the bending region 201 and the main display region 101. The second trough hole 4 is disposed between two adjacent pixel units 10. The anode electrode 12 is disposed on the array substrate 11. The first trough hole 3 is correspondingly disposed in each pixel unit 10 and directly below the anode electrode 12.

Obviously, in order to adapt to various conditions, a series of disadvantages such as cracks occurring in the display region 100 are improved by more effectively blocking or extending the path for transmitting stress. The second trough hole 4 is also disposed between one of the pixel units 10 close to the main display region 101 and the main display region 101, and/or disposed between one of the pixel units 10 close to the bending region 201 and the bending region 201.

Figure 6:
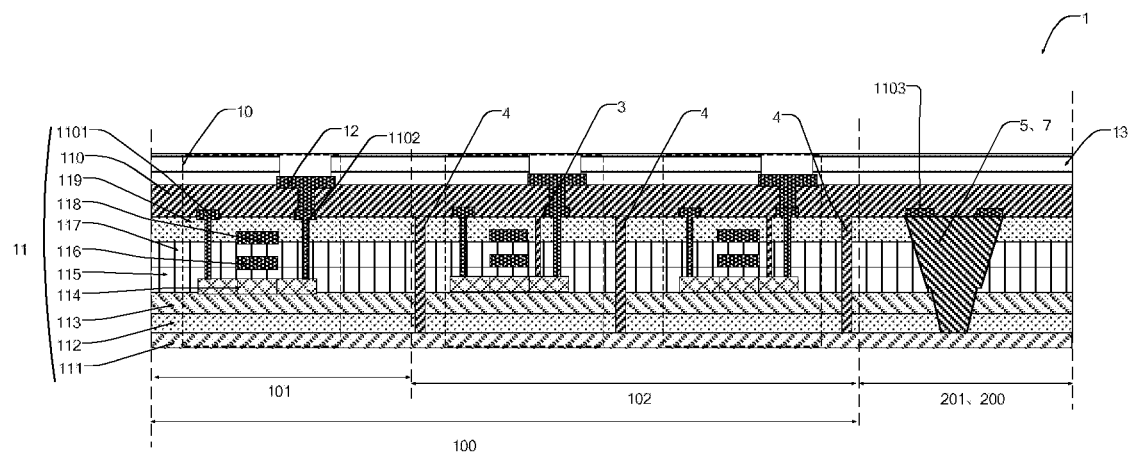
FIG. 6 illustrates the structural diagram of the display device of the embodiment of the present disclosure after forming a pixel defining layer.

Please refer to FIG. 6, more particularly, the array substrate 11 includes a base substrate 111, a blocking layer 112, a buffer layer 113, an active layer 114, a first gate insulating layer 115, a first gate layer 116, a second gate insulating layer 117, a second gate layer 118, a dielectric interlayer 119, a planarization layer 110, a source electrode 1101, a drain electrode 1102, and a filling layer. The base substrate 111 extends from the display region 100 to the non-display region 200. The base substrate 111 is a flexible base substrate. The blocking layer 112 is disposed on the base substrate 111 and extends from the display region 100 to the non-display region 200. The buffer layer 113 is disposed on the blocking layer 112 and extends from the display region 100 to the non-display region 200. The active layer 114 is disposed on the buffer layer 113 in the display region 100. The first gate insulating layer 115 covers on the active layer 114 and the buffer layer 113 and extends from the display region 100 to the non-display region 200. The first gate layer 116 is disposed on the first gate insulating layer 115 in the display region 100. The second gate insulating layer 117 covers on the first gate layer 116 and the first gate insulating layer 115, and extends from the display region 100 to the non-display region 200. The second gate layer 118 is disposed on the second gate insulating layer 117 in the display region 100. The dielectric interlayer 119 covers the second gate layer 118 and the second gate insulating layer 117, and extends from the display region 100 to the non-display region 200. The source electrode 1101 and the drain electrode 1102 are disposed on the dielectric interlayer 119 in the display region 100, and are correspondingly connected to the active layer 114. The planarization layer 110 covers the source electrode 1101, the drain electrode 1102, and the dielectric interlayer 119, and extends from the display region 100 to the non-display region 200. The anode electrode 12 is correspondingly disposed on the planarization layer 110 in the display region 100 and correspondingly connected to the drain electrode 1102. The pixel defining layer 13 covers the planarization layer 110 and extends from the display region 100 to the non-display region 200. The first trough hole 3 extends from the dielectric interlayer 119 to a surface of the active layer 114. The second trough hole 4 extends from the dielectric interlayer 119 to the blocking layer 112 or an inside of the buffer layer 113. In this embodiment, each of the pixel units 10 has a corresponding source electrode 1101 and a corresponding drain electrode 1102. In the auxiliary region 102, the first trough hole 3 is located between the source electrode 1101 and the drain electrode 1102 in the corresponding pixel unit 10. The first trough hole 3 and the second trough hole 4 are filled with an organic or inorganic material adopted by the planarization layer 110.

Please refer to FIG. 6. In the bending region 201, the array substrate 11 further includes a third trough hole 7 disposed in the bending region 201 and extended from the dielectric interlayer 119 to the blocking layer 112 or the inside of the buffer layer 113. The filling layer is filled in the third trough hole 7. A material of the filling layer is an organic photoresist material. The array substrate 11 further includes metal wires 1103 on the filling layer. The metal wires 1103, the source electrode 1101, and the drain electrode 1102 are disposed in the same layer.

In order to explain the present disclosure more clearly, the embodiment further provides a manufacturing method of the display device 1 which includes the following steps.

Forming the array substrate 11, forming the plurality of pixel units 10, and forming the first trough holes 3 of each of the pixel units 10 in the auxiliary region 102 between the bending region 201 and the main display region 101. The second trough hole 4 is formed between two adjacent pixel units 10.

Figure 2:
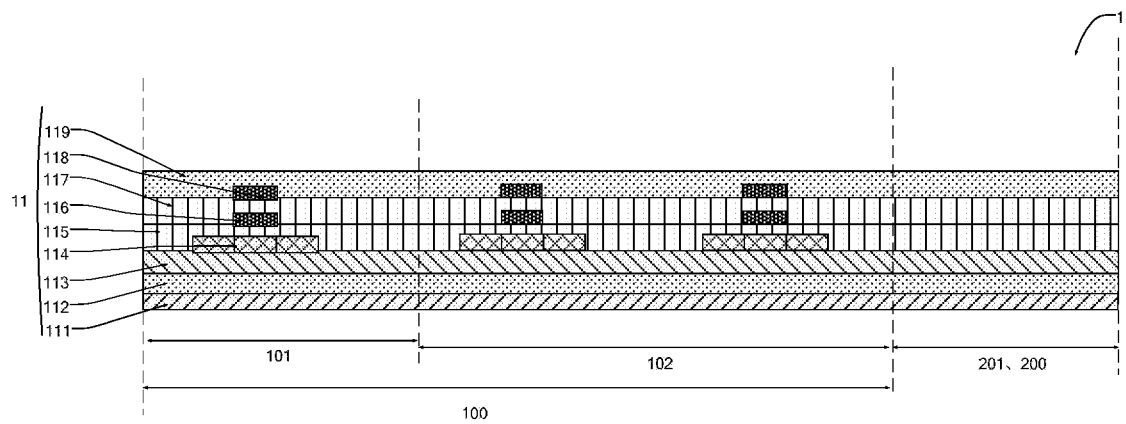
FIG. 2 illustrates the structural diagram of the display device of the embodiment of the present disclosure after forming a dielectric interlayer.

Specifically, the step of forming the array substrate 11 includes the following steps: referring to FIG. 2, the base, substrate 111 is formed and extended from the display region 100 to the non-display region 200. The blocking layer 112 is formed on the display substrate 100 and the base substrate 111 in the non-display region 200. The buffer layer 113 is formed on the display layer 100 and the blocking layer 112 in the non-display region 200. The active layer 114 is formed on the buffer layer 113 in the display region 100. The first gate insulating layer 115 is formed on the active layer 114 and the buffer layer 113 in the display region 100 and the non-display region 200. The first gate layer 116 is formed on the first gate insulating layer 115 in the display region 100. The second gate insulating layer 117 is formed on the first gate layer 116 in the display region 100 and the first gate insulating layer 115 in the display region 100 and the non-display region 200. The second gate layer 118 is formed on the second gate insulating layer 117 in the display region 100. The dielectric interlayer 119 is formed on the second gate insulating layer 117 and on the second gate layer 118 in the display region 100.

Figure 3:
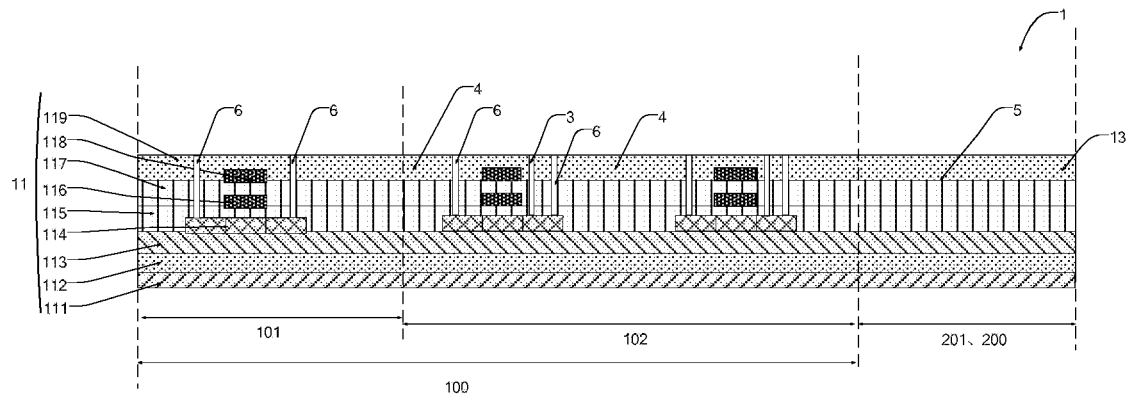
FIG. 3 illustrates the structural diagram of the display device of the embodiment of the present disclosure after forming a first trough hole.

Please refer to FIG. 3, in each of the pixel units 10 of the display region 100, two via holes 6 extending from the dielectric interlayer 119 to the surface of the active layer 114 are formed and the first trough hole 3 is synchronously formed in the auxiliary region 102 between the two via holes 6.

Figure 4:
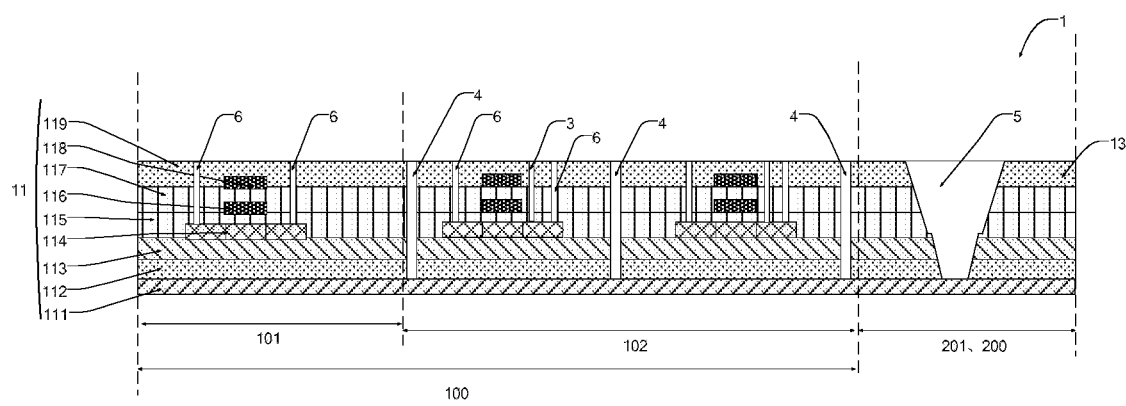
FIG. 4 illustrates the structural diagram of the display device of the embodiment of the present disclosure after forming a second trough hole.

Please refer to FIG. 4, between two adjacent pixel units 10 in the auxiliary region 102, between one of the pixel units 10 close to the main display region 101 and the main display region 101, and between one of the pixel units 10 close to the bending region 201 and the bending region 201, the second trough holes 4 are formed and extended from the dielectric interlayer 119 to the blocking layer 112 or the inside of the buffer layer 113.

Meanwhile, the second trough holes 4 are formed and extended from the dielectric interlayer 119 to the blocking layer 112 or the inside of the buffer layer 113, and third trough hole 5 is formed in the bending region 201 of the non-display region 200 and extended from the dielectric interlayer 119 to the blocking layer 112 or the inside of the buffer layer 113.

Figure 5:
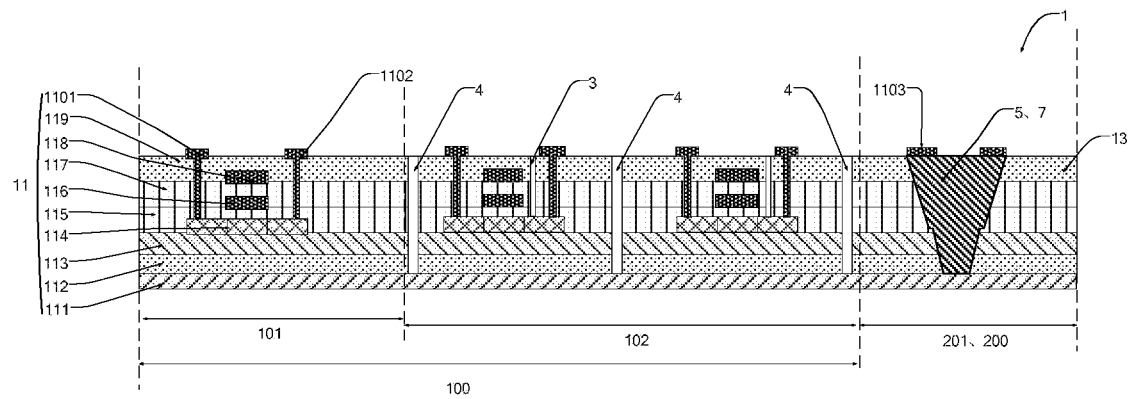
FIG. 5 illustrates the structural diagram of the display device of the embodiment of the present disclosure after forming a source electrode and a drain electrode.

Please refer to FIG. 5, organic photoresist materials are filled in the third trough hole 5 to form the filling layer. A mask (not shown) is provided and placed on the array substrate 11. The mask has a patterned hollow region corresponding to positions of the source electrode 1101, the drain electrode 1102, and the metal wires 1103.

Depositing a metal material in the via hole 6 to form the source electrode 1101 and the drain electrode 1102 on the dielectric interlayer 119 in the display region 100 and form metal wires 1103 on the filling layer in the bending region 201.

Please refer to FIG. 6, an organic or inorganic material is deposited in the second trough holes 4 and the planarization layer 110 is formed on the surfaces of the dielectric interlayer 119, the source electrode 1101, and the drain electrode 1102.

The anode electrode 12 is formed on the array substrate 11. The first trough hole 3 is located directly below the anode electrode 12.

In the step of forming the anode electrode 12 on the array substrate 11, the anode electrode 12 is formed on the planarization layer 110 in the display region 100. In the auxiliary region 102, the anode electrode 12 is located directly above the first trough hole 3.

After the step of forming the anode electrode 12 on the array substrate 11, the pixel defining layer 13 is formed on the planarization layer 110 in the display region 100 and the non-display region 200.

The display device of the present invention can be widely applied to wearable devices such as smart wristbands, smart watches, VR, flexible OLED displays like bendable OLED or rollable OLED, lighting devices, e-books, electronic newspaper, mobile phones, computers and televisions, etc.

The above-mentioned embodiments are only the preferred embodiments of the present disclosure, and are not intended to limit the present disclosure. Any modifications, equivalents, and improvements obtained within the aspect and principle of the present disclosure fall in the protected scope of the present disclosure.

What is claimed is:

1. A display device, comprising:
    a display region;
    a non-display region surrounding the display region, wherein the display region comprises a main display region and an auxiliary region surrounding the main display region, the auxiliary region is disposed between the non-display region and the main display region, and the non-display region comprises a bending region connected to the auxiliary region;
    an array substrate disposed in the display region and comprising a plurality of pixel units, a plurality of first trough holes, and a plurality of second trough holes, wherein the first trough holes and the second trough holes are disposed in the auxiliary region between the bending region and the main display region, and the second trough holes are disposed between two adjacent pixel units; and
    an anode electrode disposed on the array substrate, wherein the first trough holes are correspondingly disposed in each of the pixel units and are disposed directly below the anode electrode,
    wherein the array substrate comprises:
        a base substrate extending from the display region to the non-display region;
        a blocking layer disposed on the base substrate and extending from the display region to the non-display region;
        a buffer layer disposed on the blocking layer and extending from the display region to the non-display region;
        an active layer disposed on the buffer layer in the display region;
        a first gate insulating layer covering the active layer and the buffer layer and extending from the display region to the non-display region;
        a first gate layer covering the first gate insulating layer in the display region; a second gate insulating layer covering the first gate layer and the first gate insulating layer, and extending from the display region to the non-display region;
        a second gate layer covering the second gate insulating layer in the display region;
        a dielectric interlayer covering the second gate insulating layer and the second gate layer, and extending from the display region to the non-display region;
        a source electrode and a drain electrode disposed on the dielectric interlayer in the display region and correspondingly connected to the active layer; and
        a planarization layer covering the source electrode, the drain electrode, and the dielectric interlayer and extending from the display region to the non-display region, wherein the anode electrode is correspondingly disposed on the planarization layer and is correspondingly connected to the drain electrode;
    wherein the first trough holes extend from the dielectric interlayer to a surface of the active layer, and the second trough holes extend from the dielectric interlayer to the blocking layer or to an inside of the buffer layer,
    wherein the second trough holes are further disposed between one of the pixel units close to the main display region and the main display region, and disposed between one of the pixel units close to the bending region and the bending region, and
    the first trough holes and the second trough holes are filled with an inorganic material adopted by the planarization layer.

2. The display device according to claim 1, wherein the array substrate further comprises:
    a pixel defining layer covering the planarization layer and extending from the display region to the non-display region.

3. The display device according to claim 2, wherein in the auxillary region, each of the pixel units corresponds to the source electrode, the drain electrode, and at least one of the first trough holes, and the at least one of the first trough holes is disposed between the source electrode and the drain electrode of one of the corresponding pixel units.

4. The display device according to claim 2, wherein the array substrate further comprises:

a third trough hole disposed in the bending region and extending from the dielectric interlayer to the blocking layer or to the inside of the buffer layer; and a filling layer filled in the third trough hole.

5. A manufacturing method for manufacturing the display device according to claim 1, comprising:

forming the array substrate, forming the pixel units, wherein the auxiliary region is between the bending region and the main display region, the first trough holes are formed in each of the pixel units, and the second trough holes are formed between two adjacent pixel units, wherein the second trough holes are further disposed between one of the pixel units close to the main display region and the main display region, and disposed between one of the pixel units close to the bending region and the bending region; and forming the anode electrode on the array substrate, and the first trough holes are disposed directly below the anode electrode, wherein forming the array substrate comprises:

forming a base substrate extending from the display region to the non-display region;

forming a blocking layer on the base substrate in the display region and the non-display region;

forming a buffer layer on the blocking layer in the display region and the non-display region;

forming an active layer on the buffer layer in the display region;

forming a first gate insulating layer on the active layer and the buffer layer in the display region and the non-display region;

forming a first gate layer on the first gate insulating layer in the display region;

forming a second gate insulating layer on the first gate insulating layer and the first gate layer in the display region and the non-display region;

forming a second gate layer on the second gate insulating layer in the display region; and forming a dielectric interleaver on the second gate insulating layer and the second gate layer in the display region;

wherein in each of the pixel units in the display region, two via holes are formed and extended from the dielectric interlayer to a surface of the active layer, and the first trough holes are simultaneously formed between the two via holes in the auxiliary region;

between two adjacent pixel units in the auxiliary region, the second trough holes are formed and extended from the dielectric interlayer to the blocking layer or extended from the dielectric interlayer to an inside of the buffer layer;

depositing a metal material in the via holes and forming a source electrode and a drain electrode in the dielectric interlayer; and depositing an inorganic material in the first trough holes and the second trough holes and forming a planarization layer on surfaces of the dielectric interlayer, the source electrode, and the drain electrode.

6. The manufacturing method according to claim 5, wherein forming the anode electrode on the array substrate comprises: forming the anode electrode on the planarization layer in the display region, wherein the anode electrode is disposed directly above the first trough holes in the auxiliary region, and forming a pixel defining layer on the planarization layer in the display region and the non-display region after forming the anode electrode on the array substrate.

7. The manufacturing method according to claim 5, wherein while forming the second trough holes extending from the dielectric interlayer to the blocking layer or extending from the dielectric interlayer to the inside of the buffer layer, forming a third trough hole extending from the dielectric interlayer to the blocking layer or extending from the dielectric interlayer to the inside of the buffer layer in the bending region of the non-display region;

filling the third trough hole with an organic photoresist material to form a filling layer before forming the source electrode and the drain electrode; and forming metal wires on the filling layer while forming the source electrode and the drain electrode.

* * * * *